United States Patent
Hyun et al.

(10) Patent No.: US 6,822,490 B2
(45) Date of Patent: Nov. 23, 2004

(54) DATA OUTPUT CIRCUIT FOR REDUCING SKEW OF DATA SIGNAL

(75) Inventors: Dong-ho Hyun, Suwon (KR); Jong-hyoung Lim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/609,896

(22) Filed: Jun. 30, 2003

(65) Prior Publication Data

US 2004/0017238 A1 Jan. 29, 2004

(30) Foreign Application Priority Data

Jul. 24, 2002 (KR) .............................. 10-2002-0043694

(51) Int. Cl.[7] .................................................. H03B 1/00
(52) U.S. Cl. ........................................ 327/108; 326/82
(58) Field of Search ................................ 327/108, 109, 327/112, 333; 326/82, 83, 86, 87, 90

(56) References Cited

U.S. PATENT DOCUMENTS 6,169,421 B1 * 1/2001 Bryan et al. .................. 326/83
6,559,676 B1 * 5/2003 Tomita ......................... 326/81

FOREIGN PATENT DOCUMENTS

KR         2002-424161       * 1/2002

* cited by examiner

Primary Examiner—Linh My Nguyen
(74) Attorney, Agent, or Firm—Mills & Onello LLP

(57) ABSTRACT

In a data output circuit for reducing a skewing error of a data signal, a first inversion unit receives a first data signal of an operating voltage level and inverts the received first data signal to obtain a first inverted data signal. If a first power supply voltage of an output voltage level is different from a second power supply voltage with the operating voltage level by at least a predetermined voltage level, a first voltage compensation unit compensates for the voltage level of the first inverted data signal to obtain a first driving signal. A second inversion unit receives a second data signal with the operating voltage level and inverts the received second data signal to obtain a second inverted data signal. If the levels of the first and second power supply voltages are different by at least a predetermined voltage level, a second voltage compensation unit compensates for the voltage level of the second inverted data signal to obtain a second driving signal. A driver unit receives the first and second driving signals and outputs an output data signal with a logic level that is opposite to the logic levels of the first and second driving signals.

30 Claims, 8 Drawing Sheets

DATA OUTPUT CIRCUIT FOR REDUCING SKEW OF DATA SIGNAL

This application claims the priority of Korean Patent Application No. 2002-43964, filed Jul. 24, 2002, in the Korean Intellectual Property Office, the disclosure of which is incorporated herein in its entirety by reference.

BACKGROUND OF THE INVENTION

1. Field of the Invention

The present invention relates to a data output circuit, and more particularly, to a data output circuit by which, if an output voltage level is different from an operating voltage level, the difference is detected, and consequently the skew of an output data signal is controlled.

2. Description of the Related Art

As semiconductor devices evolve, they continue to consume a large amount of power while, at the same time, continue to demand high-speed operation. Accordingly, methods for reducing power consumption have been proposed, including the commonly used approach of lowering the operating voltage level.

Hence, in a single semiconductor device, circuits that interface with each other may use different voltage sources. In particular, a voltage source for operating the internal circuit of a semiconductor device may be different from a voltage source for an output driver circuit that outputs a data signal.

FIG. 1 is a circuit diagram of a conventional data output circuit that utilizes first and second operating voltage levels that are different. Referring to FIG. 1, a conventional data output circuit 100 includes a buffer logic unit 110, a pre-driver unit 120, and a main driver unit 130.

The buffer logic unit 110 buffers a data signal DATA and an inverted data signal DATA for a predetermined period of time in response to a clock signal CLK to obtain first and second data signals DATA1 and DATA2. To perform this operation, the buffer logic unit 110 includes transmission gates 111 and 113 and inverters I1, I2, I3, I4, and I5.

The buffer logic unit 110 can further include an NMOS transistor MN2 and resistors R1 and R2 for controlling skew of the second data signal DATA2 in response to a comparison voltage signal VCOM. Generation of the comparison voltage signal VCOM is described below with reference to FIG. 2.

Power for the buffer logic unit 110 is supplied according to the operating voltage level of the internal circuit (not shown) of the data output circuit 100.

The pre-driver unit 120 converts the first and second data signals DATA1 and DATA2, which have an operating voltage level, into first and second driving signals DRV1 and DRV2, which have the output voltage level. The logic levels of the first and second data signals DATA1 and DATA2 are opposite to those of the first and second driving signals DRV1 and DRV2.

To perform the above operation, the pre-driver unit 120 includes NMOS transistors MN0 and MN1 and PMOS transistors MP0 and MP1, which are coupled between a first power supply voltage VDDQ and a first ground voltage VSSQ, which both have the output voltage level.

The main driver unit 130 outputs an output data signal DATAOUT in response to the first and second driving signals DRV1 and DRV2. To achieve this, the main driver unit 130 includes an NMOS transistor MN3 and a PMOS transistor MP3, which are coupled between a first power supply voltage VDDQ and a first ground voltage VSSQ, which both have the output voltage level.

The power for the buffer logic unit 110 of the conventional data output circuit 100 is supplied at a power supply voltage having the operating voltage level for operating the internal circuit (not shown) of the conventional data output circuit 100. Generally, the power supply voltage has a voltage level of 3.3V or 2.5V.

Both the pre-driver unit 120 and the main driver unit 130 have a first power supply voltage VDDQ and a first ground voltage VSSQ, which both have an output voltage level. The output voltage level is normally the same as an operating voltage level, but in recent trends the output voltage level is becoming lower than the operating voltage level when considering the need for high-speed operation and low power consumption in the output process.

In the conventional data output circuit 100, when the output voltage level used in the pre-driver unit 120 and the main driver unit 130 is different from the operating voltage level, the inclinations of the first and second driving signals DRV1 and DRV2 of the pre-driver unit 120 are changed, and consequently the output data signal DATAOUT is skewed.

In order to prevent skewing, the data output circuit 100 activates the comparison voltage signal VCOM and shortens the time required to transfer the second driving signal DRV2 to a high level by using a turn-on resistor of the NMOS transistor MN2 rather than the second resistor R2.

The comparison voltage signal VCOM may be automatically generated by detecting a change in the level of the first power supply voltage VDDQ with an output voltage level, or may be set through a mode register setting (MRS) process upon power-up of the circuit, or may be pre-programmed in a fuse-cutting procedure, for example.

FIG. 2 is a circuit diagram of a circuit for automatically generating the comparison voltage signal of FIG. 1. Referring to FIG. 2, an appropriate reference potential for a second power supply voltage VDD with an operating voltage level is generated using the ratio of resistances RA and RB. The reference potential is compared with the first power supply voltage VDDQ having the output voltage level in comparator 210.

If the level of the first power supply voltage VDDQ is equal to or less than a predetermined voltage level, a comparative voltage signal VCOM at an active, or high, level is generated at inverter 220.

However, the conventional method of FIG. 2 of automatically sensing a change in the first power supply voltage VDDQ has a problem in that the reference potential itself may be changed since the resistors RA and RB are sensitive to process change and the voltage level of the second power supply voltage VDD may vary, for example, by ±0.3V.

The method of FIG. 1 of changing the turn-on resistance of the NMOS transistor MN2 by activating the comparison voltage signal VCOM also has some problems in that the turn-on resistance of the NMOS transistor MN2 cannot be zero and can vary as a result of variation in the voltage level of the comparison voltage signal VCOM that is made depending on the voltage level of the second power supply voltage VDD.

In order to activate the output data signal DATAOUT of FIG. 1, the first driving signal DRV1 must have a low level, or the second driving signal DRV2 must have a high level.

In order to achieve this, the level of the first data signal DATA1 of FIG. 1 must be high so that a voltage $V_{gs}$ between the gate and source of the NMOS transistor MN0 is VDD-VSSQ. Alternatively, the level of the second data signal DATA2 of FIG. 1 must be low so that a voltage Vgs between the gate and source of the PMOS transistor MP1 is VDDQ-VSS.

However, if the voltage level of the first power supply voltage VDDQ changes, the voltage Vgs between the gate and source of the NMOS transistor MN0 does not change, however, the voltage Vgs between the gate and source of the PMOS transistor MP1 changes according to the voltage level of the first power supply voltage VDDQ.

Consequently, when the level of the first power supply voltage VDDQ is low, the voltage Vgs between the gate and source of the PMOS transistor MP1 is reduced. Thus, the slope of the second driving signal DRV2 becomes more gradual, and, as a result, the output data signal DATAOUT becomes additionally skewed.

SUMMARY OF THE INVENTION

Accordingly, the present invention provides a data output circuit by which, in the case where an output voltage level is different from an operating voltage level, a variation in the output voltage level is detected, and consequently the skew of the output data signal is controlled.

According to a first aspect of the present invention, there is provided a data output circuit including first and second inversion units, first and second voltage compensation units, and a driver unit. The first inversion unit receives a first data signal of an operating voltage level and inverts the received first data signal to obtain a first inverted data signal. If a first power supply voltage of an output voltage level is different from a second power supply voltage of the operating voltage level by at least a predetermined voltage level, the first voltage compensation unit compensates for the voltage level of the first inverted data signal to obtain a first driving signal. The second inversion unit receives a second data signal with the operating voltage level and inverts the received second data signal to obtain a second inverted data signal. If the levels of the first and second power supply voltages are different by at least a predetermined voltage level, the second voltage compensation unit compensates for the voltage level of the second inverted data signal to obtain a second driving signal. The driver unit receives the first and second driving signals and outputs an output data signal with a logic level that is opposite to the logic levels of the first and second driving signals.

The first inversion unit forms an inverter by a first PMOS transistor and a first NMOS transistor being serially connected between the first power supply voltage and a first ground voltage of the output voltage level. The first data signal is applied to the gate of the first PMOS transistor and the gate of the first NMOS transistor.

The second inversion unit forms an inverter by a second PMOS transistor and a second NMOS transistor being serially connected between the first power supply voltage and the first ground voltage. The second data signal is applied to the gate of the second PMOS transistor and the gate of the second NMOS transistor.

The first voltage compensation unit includes first and second compensation PMOS transistors. The first compensation PMOS transistor has a source connected to the second power supply voltage and a gate subjected to the first power supply voltage. The second compensation PMOS transistor has a source connected to the drain of the first compensation PMOS transistor, a gate subjected to the first data signal, and a drain connected to a connection node between the first PMOS transistor and the first NMOS transistor.

The first voltage compensation unit compensates for the voltage level of the first inverted data signal if the first and second power supply voltages are different by at least a threshold voltage level of the first compensation PMOS transistor.

The second voltage compensation unit includes third and fourth compensation PMOS transistors. The third compensation PMOS transistor has a source connected to the second power supply voltage and a gate subjected to the first power supply voltage. The fourth compensation PMOS transistor has a source connected to the drain of the third compensation PMOS transistor, a gate subjected to the second data signal, and a drain connected to a connection node between the second PMOS transistor and the second NMOS transistor.

The second voltage compensation unit compensates for the voltage level of the second inverted data signal if the first and second power supply voltages are different by at least a threshold voltage level of the third compensation PMOS transistor.

The first and second data signals preferably have the same level.

The first voltage compensation unit includes first and second compensation PMOS transistors, first through N-th load PMOS transistors, and a first load NMOS transistor. The first compensation PMOS transistor has a source connected to the second power supply voltage and a gate subjected to a first drop voltage. The second compensation PMOS transistor has a source connected to the drain of the first compensation PMOS transistor, a gate subjected to the first data signal, and a drain is connected to a connection node between the first PMOS transistor and the first NMOS transistor. The first through N-th load PMOS transistors are serially connected to the first power supply voltage. The first load NMOS transistor is connected between the N-th load PMOS transistor and a second ground voltage, and has a drain which generates the first drop voltage and a gate and a source which are connected to each other.

The voltage compensation unit compensates for the voltage level of the first inverted data signal if the second power supply voltage and the first drop voltage are different by at least the threshold voltage level of the first compensation PMOS transistor. The level of the first drop voltage is determined according to the number of first through N-th load PMOS transistors.

The second voltage compensation unit includes third and fourth compensation PMOS transistors, (N+1)th through M-th load PMOS transistors, and a second load NMOS transistor. The third compensation PMOS transistor has a source connected to the second power supply voltage and a gate subjected to a second drop voltage. The fourth compensation PMOS transistor has a source connected to the drain of the third compensation PMOS transistor, a gate subjected to the second data signal, and a drain connected to a connection node between the second PMOS transistor and the second NMOS transistor. The (N+1)th through M-th load PMOS transistors are serially connected to the first power supply voltage. The second load NMOS transistor is connected between the M-th load PMOS transistor and a second ground voltage, and has a drain which generates the second drop voltage and a gate and a source which are connected to each other.

The second voltage compensation unit compensates for the voltage level of the second inverted data signal if the second power supply voltage and the second drop voltage are different by at least the threshold voltage level of the third compensation PMOS transistor. The level of the second drop voltage is determined according to the number of (N+1)th through M-th load PMOS transistors.

According to a second aspect of the present invention, there is provided a data output circuit including first and second inversion units, first and second voltage compensation units, and a driver unit. If an output voltage level of a first power supply voltage is equal to an operating voltage level of a second power supply voltage, the first inversion unit receives a first data signal of an operating voltage level and inverts the received first data signal to obtain a first inverted data signal. If the levels of the first and second power supply voltages are different by at least a voltage level, the first voltage compensation unit compensates for the voltage level of the first inverted data signal to obtain a first driving signal. If the levels of the first and second power supply voltages are the same, a second inversion unit receives a second data signal with an operating voltage level and inverts the received second data signal to obtain a second inverted data signal. If the levels of the first and second power supply voltages are different by at least a predetermined voltage level, a second voltage compensation unit compensates for the voltage level of the second inverted data signal to obtain a second driving signal. The driver unit receives the first and second driving signals and outputs an output data signal with a logic level that is opposite to the logic levels of the first and second driving signals.

The first inversion unit includes first and second inversion PMOS transistors, a first inversion NMOS transistor, and a first control voltage generation unit. The first inversion PMOS transistor has a source connected to the first power supply voltage and a gate subjected to a first control voltage. The second inversion PMOS transistor has a source connected to the drain of the first inversion PMOS transistor, a gate subjected to the first data signal, and a drain which generates the first inverted data signal. The first inversion NMOS transistor has a drain connected to the drain of the second inversion PMOS transistor, a gate subjected to the first data signal, and a source connected to a first ground voltage. If the levels of the first and second power supply voltages are the same, the first control voltage generation unit generates the first control voltage to have a first logic level. If the level of the first power supply voltage is less than that of the second power supply voltage by a predetermined voltage level, the first control voltage generation unit generates the first control voltage to have a second logic level.

The first control voltage generation unit includes a first control PMOS transistor, first through N-th load PMOS transistors, and a first control NMOS transistor. The first control PMOS transistor has a source connected to the second power supply voltage and a gate subjected to the first power supply voltage. The first through N-th load PMOS transistors are serially connected to the first control PMOS transistor. The first control NMOS transistor is connected between the N-th load PMOS transistor and a second ground voltage, and has a drain which generates the first control voltage and a gate and a source which are connected to each other.

The first voltage compensation unit includes first and second compensation PMOS transistors. The first compensation PMOS transistor has a source connected to the second power supply voltage and a gate subjected to the first power supply voltage. The second compensation PMOS transistor has a source connected to the drain of the first compensation PMOS transistor, a gate subjected to the first data signal, and a drain connected to a connection node between the second inversion PMOS transistor and the first inversion NMOS transistor.

The first voltage compensation unit compensates for the voltage level of the first inverted data signal if the first and second power supply voltages are different by at least a threshold voltage level of the first compensation PMOS transistor.

The second inversion unit includes third and third inversion PMOS transistors, a second inversion NMOS transistor, and a second control voltage generation unit. The third inversion PMOS transistor has a source connected to the first power supply voltage and a gate subjected to a second control voltage. The fourth inversion PMOS transistor has a source connected to the drain of the third inversion PMOS transistor, a gate subjected to the second data signal, and a drain which generates the second inverted data signal. The second inversion NMOS transistor has a drain connected to the drain of the fourth inversion PMOS transistor, a gate subjected to the second data signal, and a source connected to a first ground voltage. If the levels of the first and second power supply voltages are the same, the second control voltage generation unit generates the second control voltage to have a first logic level. If the level of the first power supply voltage is less than that of the second power supply voltage by a predetermined voltage level, the second control voltage generation unit generates the second control voltage to have a second logic level.

The second control voltage generation unit includes a second control PMOS transistor, (N+1)th through M load PMOS transistors, and a second control NMOS transistor. The second control PMOS transistor has a source connected to the second power supply voltage and a gate subjected to the first power supply voltage. The (N+1)th through M load PMOS transistors are serially connected to the second control PMOS transistor. The second control NMOS transistor is connected between the M-th load PMOS transistor and a second ground voltage, and has a drain which generates the second control voltage and a gate and a source which are connected to each other.

The second voltage compensation unit includes third and fourth compensation PMOS transistors. The third compensation PMOS transistor has a source connected to the second power supply voltage and a gate subjected to the first power supply voltage. The fourth compensation PMOS transistor has a source connected to the drain of the third compensation PMOS transistor, a gate subjected to the second data signal, and a drain connected to a connection node between the fourth inversion PMOS transistor and the second inversion NMOS transistor.

The second voltage compensation unit compensates for the voltage level of the second inverted data signal if the first and second power supply voltages are different by at least a threshold voltage level of the third compensation PMOS transistor.

The first and second data signals preferably have the same level.

According to a third aspect of the present invention, there is provided a data output circuit including first and second inversion units, first and second voltage compensation units, first and second control units, and a driver unit. If an output voltage level of a first power supply voltage is equal to an operating voltage level of a second power supply voltage, the first inversion unit receives a first data signal of an operating voltage level and inverts the received first data signal to obtain a first inverted data signal. If the levels of the first and second power supply voltages are different by at least a predetermined voltage level, the first voltage compensation unit compensates for the voltage level of the first inverted data signal to obtain a first driving signal. If the levels of the first and second power supply voltages are the same, the first control unit generates a first control signal for controlling the operation of the first voltage compensation unit. If the levels of the first and second power supply voltages are different by at least a predetermined voltage level, the first control unit generates a second control signal for controlling the operation of the first inversion unit. If the levels of the first and second power supply voltages are the same, the second inversion unit receives a second data signal with an operating voltage level and inverts the received second data signal to obtain a second inverted data signal. If the levels of the first and second power supply voltages are different by at least a predetermined voltage level, the second voltage compensation unit compensates for the voltage level of the second inverted data signal to obtain a second driving signal. If the levels of the first and second power supply voltages are the same, the second control unit generates a third control signal for controlling the operation of the second voltage compensation unit. If the levels of the first and second power supply voltages are different by at least a predetermined voltage level, the second control unit generates a fourth control signal for controlling the operation of the second inversion unit. The driver unit receives the first and second driving signals and outputs an output data signal with a logic level that is opposite to the logic levels of the first and second driving signals.

The first inversion unit includes first and second inversion PMOS transistors and a first inversion NMOS transistor. The first inversion PMOS transistor has a source connected to the first power supply voltage and a gate subjected to the second control signal. The second inversion PMOS transistor has a source connected to the drain of the first inversion PMOS transistor, a gate is subjected to the first data signal, and a drain which generates the first inverted data signal. The first inversion NMOS transistor has a drain connected to the drain of the second inversion PMOS transistor, a gate subjected to the first data signal, and a source connected to a first ground voltage.

The first control unit includes a first control PMOS transistor, a first control NMOS transistor, and first and second inverters. The first control PMOS transistor has a source connected to the second power supply voltage and a gate subjected to the first power supply voltage. The first control NMOS transistor has a drain connected to the drain of the first control PMOS transistor and a gate and a source which are connected to a second ground voltage. The first inverter is connected to a connection node between the first control PMOS transistor and the first control NMOS transistor, and generates the first control signal. The second inverter is connected to the first inverter and generates the second control signal.

The first voltage compensation unit includes first and second compensation PMOS transistors. The first compensation PMOS transistor has a source connected to the second power supply voltage and a gate subjected to the first control signal. The second compensation PMOS transistor has a source connected to the drain of the first compensation PMOS transistor, a gate subjected to the first data signal, and a drain connected to a connection node between the second inversion PMOS transistor and the first inversion NMOS transistor.

The second inversion unit includes third and fourth inversion PMOS transistors and a second inversion NMOS transistor. The third inversion PMOS transistor has a source connected to the first power supply voltage and a gate subjected to a fourth control signal. The fourth inversion PMOS transistor has a source connected to the drain of the third inversion PMOS transistor, a gate subjected to the second data signal, and a drain which generates the second inverted data signal. The second inversion NMOS transistor has a drain connected to the drain of the fourth inversion PMOS transistor, a gate subjected to the second data signal, and a source connected to a first ground voltage.

The second control unit includes a second control PMOS transistor, a second control NMOS transistor, and third and fourth inverters. The second control PMOS transistor has a source connected to the second power supply voltage and a gate subjected to the first power supply voltage. The second control NMOS transistor has a drain connected to the drain of the second control PMOS transistor and a gate and a source which are connected to a second ground voltage. The third inverter is connected to a connection node between the second control PMOS transistor and the second control NMOS transistor, and generates the third control signal. The fourth inverter is connected to the third inverter and generates the fourth control signal.

The second voltage compensation unit includes third and fourth compensation PMOS transistors. The third compensation PMOS transistor has a source connected to the second power supply voltage and a gate subjected to the third control signal. The fourth compensation PMOS transistor has a source connected to the drain of the first compensation PMOS transistor, a gate subjected to the second data signal, and a drain connected to a connection node between the fourth inversion PMOS transistor and the second inversion NMOS transistor.

The first and second data signals preferably have the same level.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF PREFERRED EMBODIMENTS

Figure 1:
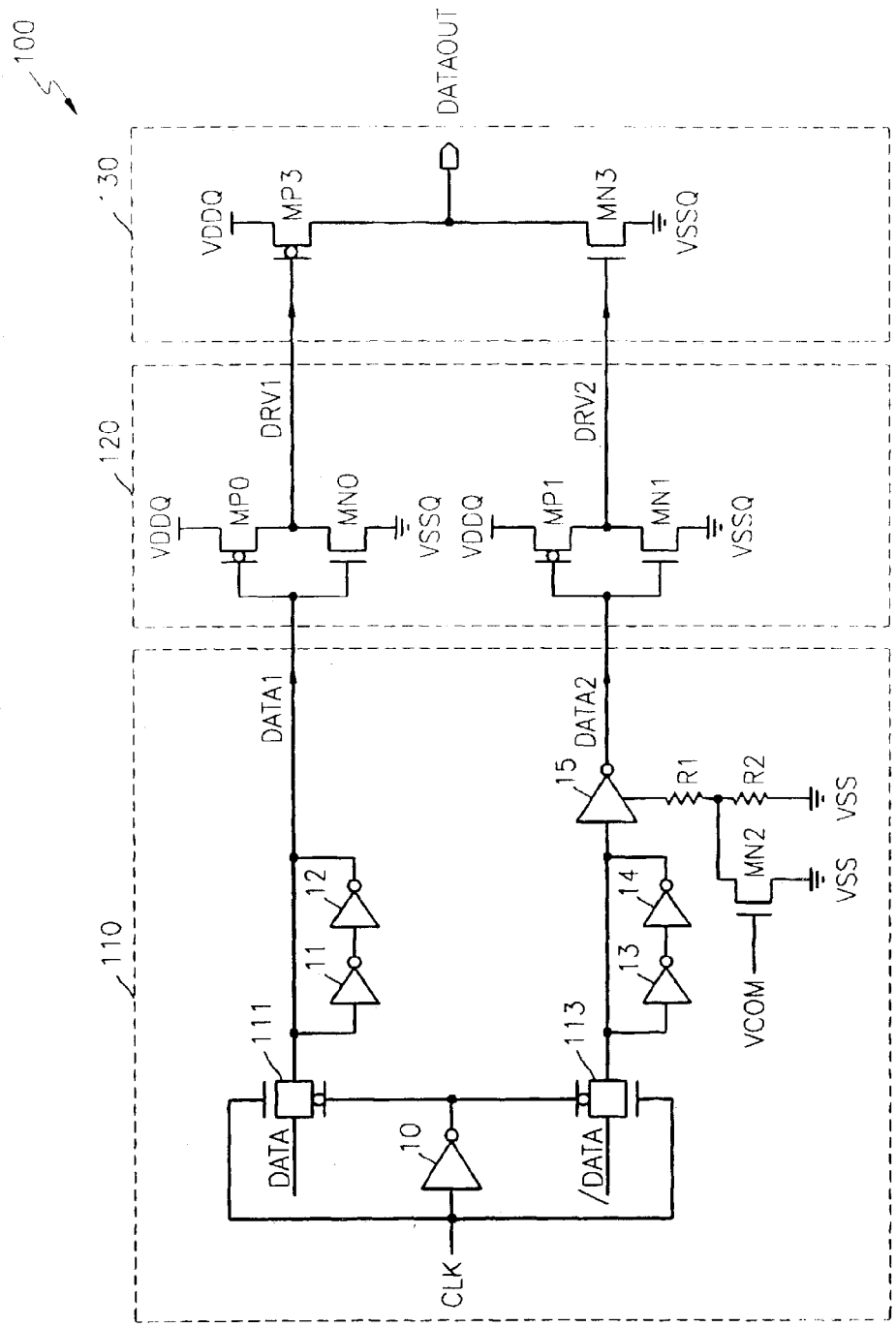
FIG. 1 is a circuit diagram of a conventional data output circuit in which an operating voltage level and an output voltage level are different.
Figure 2:
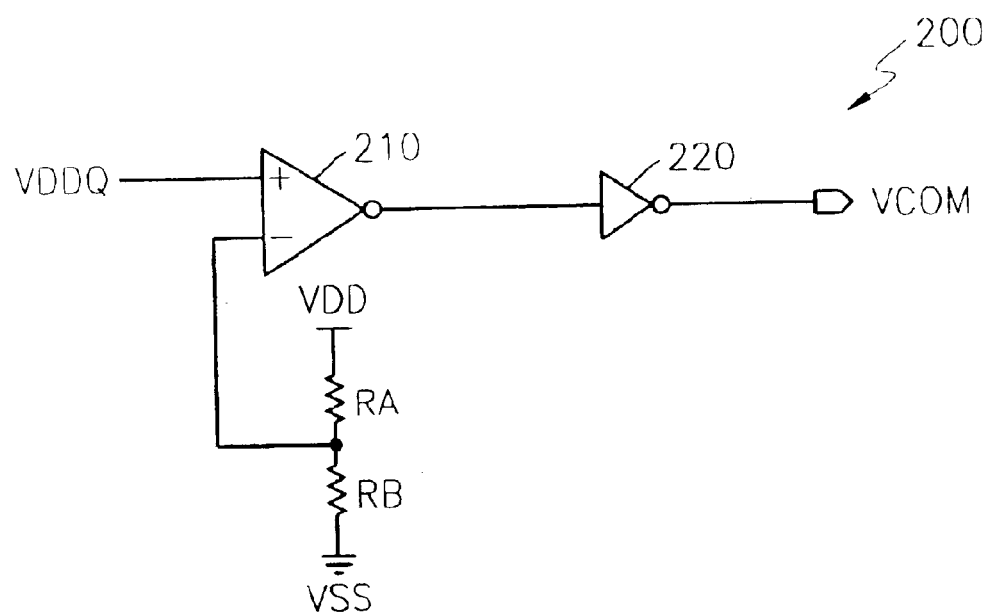
FIG. 2 is a circuit diagram of a circuit for automatically generating the comparison voltage signal of FIG. 1.

The present invention will now be described more fully with reference to the accompanying drawings, in which preferred embodiments of the invention are shown. The embodiments of the present invention are provided in order to more completely explain the present invention to anyone skilled in the art. In the drawings, the same reference numerals denote the same member.

Figure 3:
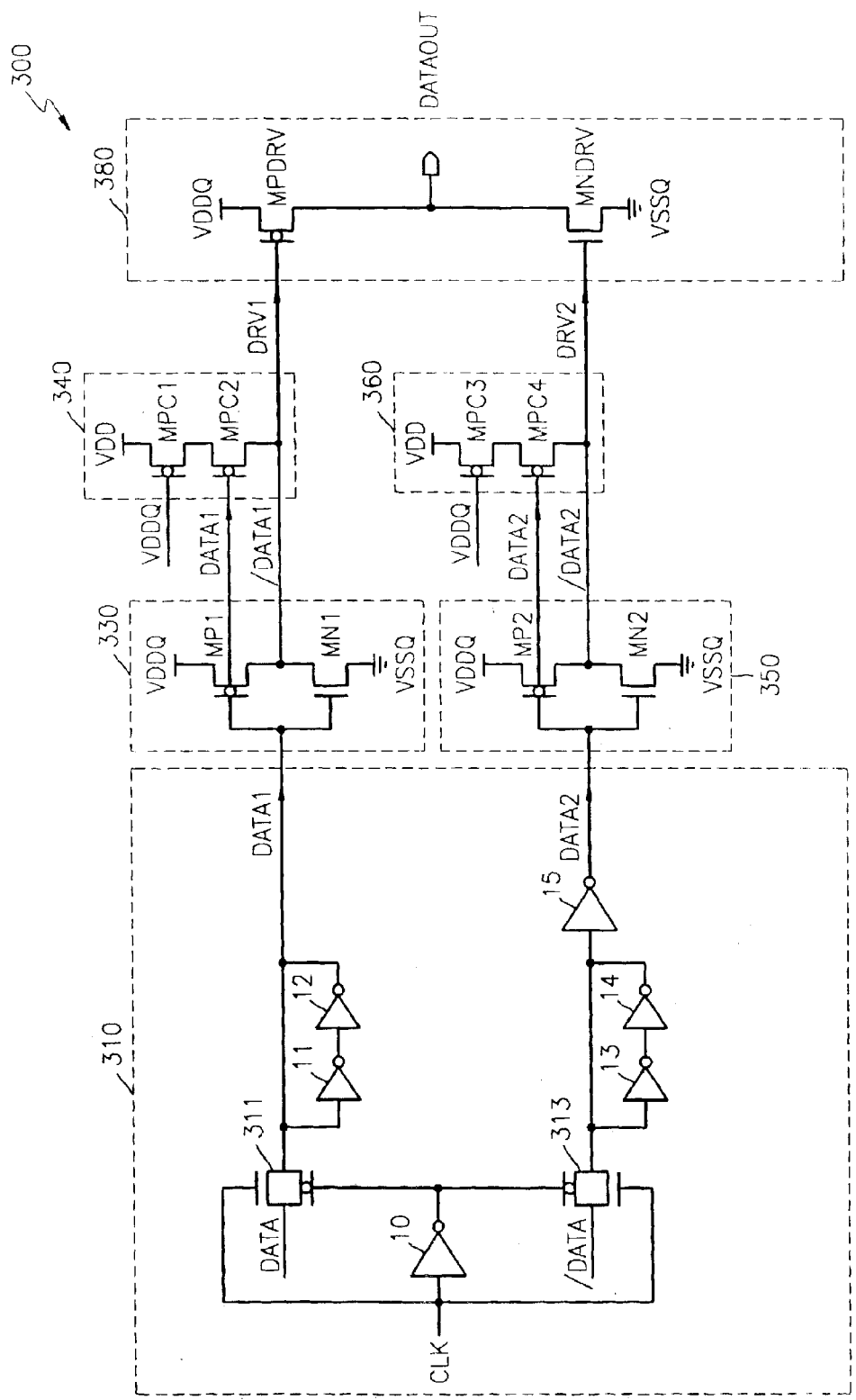
FIG. 3 is a circuit diagram of a data output circuit according to a first embodiment of the present invention.

Referring to FIG. 3, a data output circuit 300 according to a first embodiment of the present invention includes a first inversion unit 330, a first voltage compensation unit 340, a second inversion unit 350, a second voltage compensation unit 360, and a driver unit 380.

In FIG. 3, a buffer logic unit 310 for storing and outputting data in response to a clock signal CLK is further shown to facilitate understanding of the operation of the data output circuit 300. The buffer logic unit 310 includes transmission gates 311 and 313 for outputting data DATA and inverted data /DATA in response to the clock signal CLK.

The data signal DATA passes inverters I1 and I2 and is output as a first data signal DATA1. The inverted data signal /DATA passes inverters I3, I4, and I5 and is output as a second data signal DATA2. The first and second data signals DATA1 and DATA2 have the same logic level.

Both the data DATA and the inverted data/DATA have an operating voltage level for operating the internal circuit (not shown) of the data output circuit 300. Accordingly, the first and second data signals DATA1 and DATA2 have the same logic level.

The first inversion unit 330 receives the first data signal DATA1 having an operating voltage level, inverts the received first data signal DATA1, and generates a first inverted data signal /DATA1.

In the first inversion unit 330, a first PMOS transistor MP1 and a first NMOS transistor MN1 that are serially connected to each other are coupled between a first power supply voltage VDDQ and a first ground voltage VSSQ, which have an output voltage level, thereby forming an inverter.

The first data signal DATA1 is applied to the gate of the first PMOS transistor MP1 and that of the first NMOS transistor MN1.

Since the output data signal DATAOUT has a high frequency, the output voltage level is set to be lower than the operating voltage level in order to reduce power consumption.

Since the first inversion unit 330 operates between the first power supply voltage VDDQ and the first ground voltage VSSQ, which both have the output voltage level, the first inverted data signal DATA1 has the output voltage level.

If the level of the first data signal DATA1 is high, the first NMOS transistor MN1 is turned on, and thus a first inverted data signal DATA1 with a low level will be generated. If the level of the first data signal DATA1 is low, the first PMOS transistor MP1 is turned on, and thus a first inverted data signal DATA1 with a high level will be generated.

The second inversion unit 350 receives the second data signal DATA2 having the operating voltage level, inverts the received second data signal DATA2, and generates a second inverted data signal DATA2.

In the second inversion unit 350, a second PMOS transistor MP2 and a second NMOS transistor MN2 that are serially connected to each other are coupled between a first power supply voltage VDDQ and a first ground voltage VSSQ, thereby forming an inverter.

The second data signal DATA2 is applied to the gate of the second PMOS transistor MP2 and that of the second NMOS transistor MN2.

Since the second inversion unit 350 has the same structure as the first inversion unit 330, the operation of the second inversion unit 350 will not be described in detail.

The first and second inverted data signals/DATA1 and /DATA2 have an output voltage level that is lower than the operating voltage level. Hence, the slopes of the first and second inverted data signals/DATA1 and /DATA2 may become smaller.

Accordingly, if the first and second inverted data signals/ DATA1 and /DATA2 are applied to the driver unit 380, the output data signal DATAOUT may have a skewing error. To mitigate or remove this error, the first and second voltage compensation units 340 and 360 for compensating for the voltage levels of the first and second inverted data signals /DATA1 and /DATA2, respectively, are used.

If the first power supply voltage VDDQ with an output voltage level is different from the second power supply voltage VDD with an operating voltage level by at least a predetermined voltage level, the first voltage compensation unit 340 compensates for the voltage level of the first inverted data signal DATA1 to generate a first driving signal DRV1.

To be more specific, the first voltage compensation unit 340 includes first and second compensation PMOS transistors MPC1 and MPC2.

The source of the first compensation PMOS transistor MPC1 is connected to the second power supply voltage VDD. The first power supply voltage VDDQ is applied to the gate of the first compensation PMOS transistor MPC1. The source of the second compensation PMOS transistor MPC2 is connected to the drain of the first compensation PMOS transistor MPC1. The first data signal DATA1 is applied to the gate of the second compensation PMOS transistor MPC2. The source of the second compensation PMOS transistor MPC2 is connected to a connection node between the first PMOS transistor MP1 and the first NMOS transistor MN1.

If the first and second power supply voltages VDDQ and VDD are different by at least a threshold voltage level of the first compensation PMOS transistor MPC1, the first voltage compensation unit 340 compensates for the voltage level of the first inverted data signal DATA1.

In other words, if the voltage level of the first power supply voltage VDDQ is less than a value obtained by subtracting the threshold voltage of the first compensation PMOS transistor MPC1 from the voltage level of the second power supply voltage VDD, the first compensation PMOS transistor MPC1 is turned on. If the level of the first data signal DATA1 is low, the second compensation PMOS transistor MPC2 is also turned on.

Accordingly, voltage compensation is performed so that the first inverted data signal DATA with an output voltage level has an operating voltage level. That is, the voltage level of the first inverted data signal DATA1 is increased by the second power supply voltage VDD. The first driving signal DRV1 is the first inverted data signal DATA1 whose voltage level has been increased to an operating voltage level.

If the first and second power supply voltage VDDQ and VDD are different by at least a predetermined voltage level, the second voltage compensation unit 360 compensates for the voltage level of the second inverted data signal DATA2 to generate a second driving signal DRV2.

To be more specific, the second voltage compensation unit 360 includes third and fourth compensation PMOS transistors MPC3 and MPC4.

The source of the third compensation PMOS transistor MPC3 is connected to the second power supply voltage VDD. The first power supply voltage VDDQ is applied to the gate of the third compensation PMOS transistor MPC3. The source of the fourth compensation PMOS transistor MPC4 is connected to the drain of the third compensation PMOS transistor MPC3. The second data signal DATA2 is applied to the gate of the fourth compensation PMOS transistor MPC4. The source of the fourth compensation PMOS transistor MPC4 is connected to a connection node between the second PMOS transistor MP2 and the second NMOS transistor MN2.

If the first and second power supply voltages VDDQ and VDD are different by at least a threshold voltage level of the third compensation PMOS transistor MPC3, the second voltage compensation unit 360 compensates for the voltage level of the second inverted data signal DATA2.

The operation of the second voltage compensation unit 360 is the same as that of the first voltage compensation unit 340. The voltage level of the second data signal DATA2 is equal to that of the first data signal DATA1. If the logic level of the second data signal DATA2 is a low level, the logic level of the second driving signal DRV2 is a high level.

In other words, both the first and second driving signals DRV1 and DRV2 have the high operating voltage level. If so, an NMOS transistor MNDRV of the driver unit 380 is turned on, and a PMOS transistor MPDRV of the driver unit 380 is turned off. Accordingly, an output data signal DATAOUT with a low logic level is generated. Since the first and second driving signals DRV1 and DRV2 have the operating voltage level, any skew error generated in the output data signal DATAOUT will be reduced.

The operations of the first and second voltage compensation units 340 and 360 will now be described in greater detail.

The first and second voltage compensation units 340 and 360 include the first and third compensation PMOS transistors MPC1 and MPC3, respectively, which receive the second power supply voltage VDD with an operating voltage level via their respective sources and receive the first power supply voltage VDDQ with an output voltage level via their respective gates.

In the first voltage compensation unit 340, if the difference between the first and second power supply voltages VDDQ and VDD is less than the threshold voltage of the first compensation PMOS transistor MPC1, the first compensation PMOS transistor MPC1 is turned off. In the second voltage compensation unit 360, if the difference between the first and second power supply voltages VDDQ and VDD is less than the threshold voltage of the third compensation PMOS transistor MPC3, the third compensation PMOS transistor MPC3 is turned off.

The data output circuit 300 of FIG. 3 performs the same operation as the conventional data output circuit 100 in response to the first and second driving signals DRV1, DRV2.

In the first voltage compensation unit 340, if the difference between the first and second power supply voltages VDDQ and VDD is equal to or greater than the threshold voltage of the first compensation PMOS transistor MPC1, the first compensation PMOS transistor MPC1 is turned on. In the second voltage compensation unit 360, if the difference between the first and second power supply voltages VDDQ and VDD is equal to or greater than the threshold voltage of the third compensation PMOS transistor MPC3, the third compensation PMOS transistor MPC3 is turned on.

If the first and second data signals DATA1 and DATA2 are each activated to a low level, the first PMOS transistor MP1 of the first inversion unit 330 and the second PMOS transistor MP2 of the second inversion unit 350 are turned on, and simultaneously the second PMOS transistor MP2 of the first inversion unit 330 and the fourth PMOS transistor MP4 of the second inversion unit 350 are turned on.

If so, the voltage levels of the first and second driving signals DRV1 and DRV2, having high logic levels are compensated. In other words, the voltage levels of the first and second driving signals DRV1 and DRV2 are each increased to an operating voltage level.

If the first data signal DATA1 has a low level, the voltage level of the first driving signal DRV1 with a high logic level is determined by the threshold voltage of the first PMOS transistor MP1, which is a voltage obtained by subtracting the voltage level VSS of the first data signal DATA1 from the voltage level of the first power supply voltage VDDQ.

As the voltage level of the first power supply voltage VDDQ decreases, the threshold voltage of the first PMOS transistor MP1 decreases, which slows the activation of the first driving signal DRV1 to a high level.

However, as the voltage level of the first power supply voltage VDDQ decreases, the difference between the potentials of the first and second power supply voltages VDDQ and VDD increases. Hence, the degree to which the first compensation PMOS transistor MPC1 is turned on also increases, and the activation of the first driving signal DRV1 to a high level is thus performed more rapidly.

As a result, the skewed waveform of the output data signal DATAOUT can be maintained regardless of the change in the voltage level of the first power supply voltage VDDQ.

As described above, if the second data signal DATA2 has a low level, the voltage level of the second driving signal DRV2 with a high logic level is determined by the threshold voltage of the second PMOS transistor MP2, which is a voltage obtained by subtracting the voltage level VSS of the second data signal DATA2 from the voltage level of the first power supply voltage VDDQ.

As the voltage level of the first power supply voltage VDDQ decreases, the threshold voltage of the second PMOS transistor MP2 decreases, which slows the rise time of the second driving signal DRV2 to a high level.

However, as the voltage level of the first power supply voltage VDDQ decreases, the difference between the potentials of the first and second power supply voltages VDDQ and VDD increases. Hence, the degree to which the third compensation PMOS transistor MPC3 is turned on also increases, and the activation of the second driving signal DRV2 to a high level is thereby increased.

As a result, the skewed waveform of the output data signal DATAOUT can be maintained, regardless of a change in the voltage level of the first power supply voltage VDDQ.

Figure 4A:
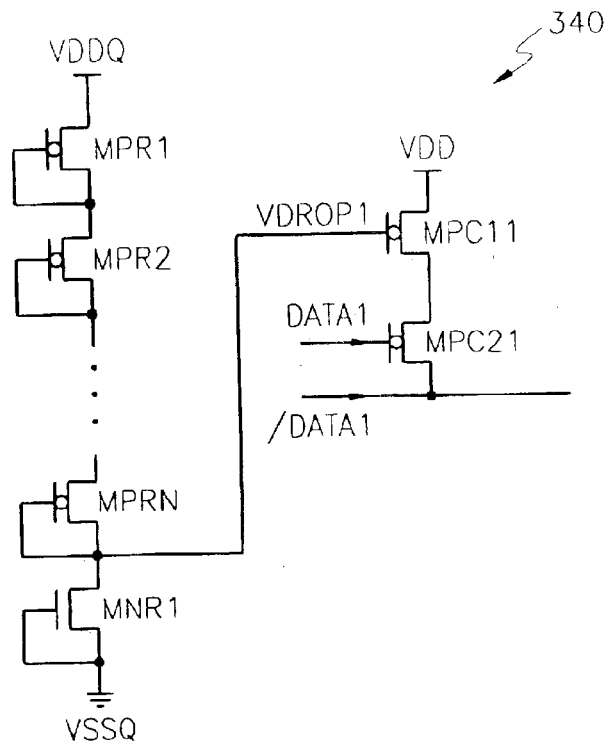
FIGS. 4A and 4B are circuit diagrams showing different circuit configurations of the voltage compensation units of FIG. 3.
Figure 4B:
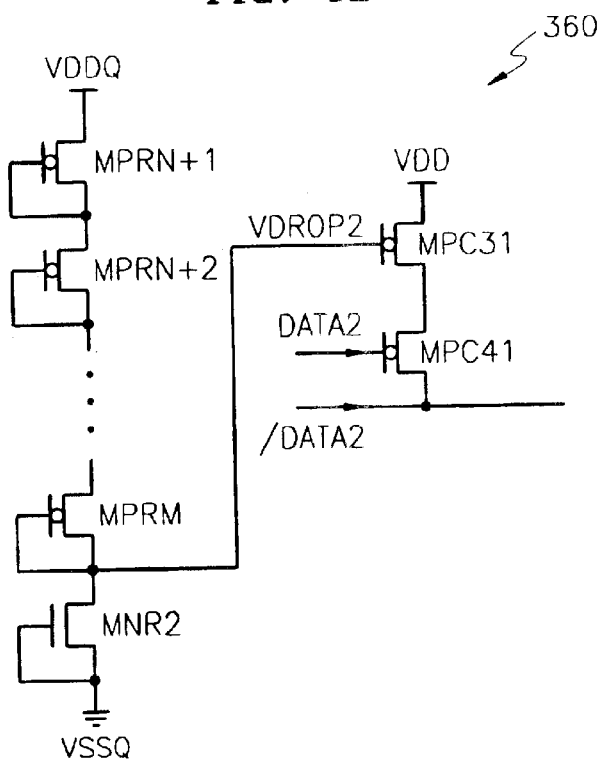

FIGS. 4A and 4B are circuit diagrams showing alternative circuit configurations of the voltage compensation units 340, 360 of FIG. 3. The first voltage compensation unit 340 includes first and second compensation PMOS transistors MPC11 and MPC21, first through N-th load PMOS transistors MPR1 through MPRN, and a first load NMOS transistor MNR1.

To be more specific, the source of the first compensation PMOS transistor MPC11 is connected to the second power supply voltage VDD, and a first drop voltage VDROP1 is applied to the gate of the first compensation PMOS transistor MPC11. The source of the second compensation PMOS transistor MPC21 is connected to the drain of the first compensation PMOS transistor MPC11, and the first data signal DATA1 is applied to the gate of the second compensation PMOS transistor MPC21. The drain of the second compensation PMOS transistor MPC21 is connected to a connection node between the first PMOS transistor MP1 and the first NMOS transistor MN1.

The first through N-th load PMOS transistors MPR1 through MPRN are serially connected to the first power supply voltage VDDQ. The first load NMOS transistor MNR1 is coupled between the N-th load PMOS transistor MPRN and the second ground voltage VSS. The drain of the first load NMOS transistor MNR1 generates the first drop voltage VDROP1, and the source and gate thereof are connected to each other.

If the difference between the second power supply voltage VDD and the first drop voltage VDROP1 is equal to or greater than the threshold voltage level of the first compensation PMOS transistor MPC11, the first voltage compensation unit 340 compensates for the voltage level of the first inverted data signal DATA1. The first drop voltage VDROP1 is determined according to the number of first through N-th load PMOS transistors MPR1 through MPRN.

The second voltage compensation unit 360 includes third and fourth compensation PMOS transistors MPC31 and MPC41, (N+1)th through M-th load PMOS transistors MPRN+1 through MPRM, and a second load NOMS transistor MNR2.

To be more specific, the source of the third compensation PMOS transistor MPC31 is connected to the second power supply voltage VDD, and a second drop voltage VDROP2 is applied to the gate of the second compensation PMOS transistor MPC31. The source of the fourth compensation PMOS transistor MPC41 is connected to the drain of the third compensation PMOS transistor MPC31, and the second data signal DATA2 is applied to the gate of the fourth compensation PMOS transistor MPC41. The drain of the fourth compensation PMOS transistor MPC41 is connected to a connection node between the second PMOS transistor MP2 and the second NMOS transistor MN2.

The (N+1)th through M-th load PMOS transistors MPRN+1 through MPRM are serially connected to the first power supply voltage VDDQ. The second load NMOS transistor MNR2 is coupled between the M-th load PMOS transistor MPRM and the second ground voltage VSS. The drain of the second load NMOS transistor MNR2 generates the second drop voltage VDROP2, and the source and gate thereof are connected to each other.

If the difference between the second power supply voltage VDD and the second drop voltage VDROP2 is equal to or greater than the threshold voltage level of the third compensation PMOS transistor MPC31, the second voltage compensation unit 360 compensates for the voltage level of the second inverted data signal DATA2. The second drop voltage VDROP2 is determined according to the number of (N+1)th through M-th load PMOS transistors MPRN+1 through MPRM.

The first and second voltage compensation units 340 and 360 of the data output circuit 300 of FIG. 3 compensate for the voltage levels of the first and second inverted data signals/DATA1 and /DATA2, respectively, if the first power supply voltage VDDQ is smaller than the second power supply voltage VDD by at least the threshold voltage levels of the first and third compensation PMOS transistors MPC1 and MPC3.

However, the first and second voltage compensation units 340 and 360 of FIG. 4 can compensate for the voltage levels of the first and second inverted data signals/DATA1 and /DATA2, respectively, even when the first power supply voltage VDDQ is smaller than the second power supply voltage VDD by a level no more than the threshold voltage levels of the first and third compensation PMOS transistors MPC11 and MPC31.

In other words, if the first and second voltage compensation units 340 and 350 of FIG. 4 are used, a change in the first power supply voltage VDDQ is more precisely detected, thus any skewing error in the output data signal DATAOUT can be more accurately controlled.

To achieve this operation, the first drop voltage VDROP1 instead of the first power supply voltage VDDQ is applied to the gate of the first compensation PMOS transistor MPC11.

The first drop voltage VDROP1 has a voltage level that is obtained by subtracting the sum of the threshold voltage levels of the first through N-th load PMOS transistors MPR1 through MPRN from the voltage level of the first power supply voltage VDDQ. That is, the voltage level of the first drop voltage VDROP1 is determined according to the number of first through N-th load PMOS transistors MPR1 through MPRN.

Even when the difference between the first and second power supply voltages VDDQ and VDD is less than the threshold voltage level of the first compensation PMOS transistors MPC11, the first compensation PMOS transistor MPC11 can be turned on if the voltage level of the first drop voltage VDROP1 is controlled by adjusting the number of first through N-th load PMOS transistors MPR1 through MPRN. In this way, the voltage level of the first inverted data signal DATA1 can be compensated.

The operation of the second voltage compensation unit 360 is the same as that of the first voltage compensation unit 340. In other words, the second drop voltage VDROP2 instead of the first power supply voltage VDDQ is applied to the gate of the third compensation PMOS transistor MPC31.

The second drop voltage VDROP2 has a voltage level that is obtained by subtracting the sum of the threshold voltage levels of the (N+1)th through M-th load PMOS transistors MPRMN+1 through MPRM from the voltage level of the first power supply voltage VDDQ. That is, the voltage level of the second drop voltage VDROP2 is determined according to the number of (N+1)th through M-th load PMOS transistors MPRN+1 through MPRM.

Even when the difference between the first power supply voltage VDDQ and the second power supply voltage VDD is less than the threshold voltage level of the third compensation PMOS transistors MPC31, the third compensation PMOS transistor MPC31 can be turned on if the voltage level of the second drop voltage VDROP2 is controlled by adjusting the number of (N+1) through M-th load PMOS transistors MPRN+1 through MPRM. In this way, the voltage level of the second inverted data signal DATA2 can be compensated.

Figure 5:
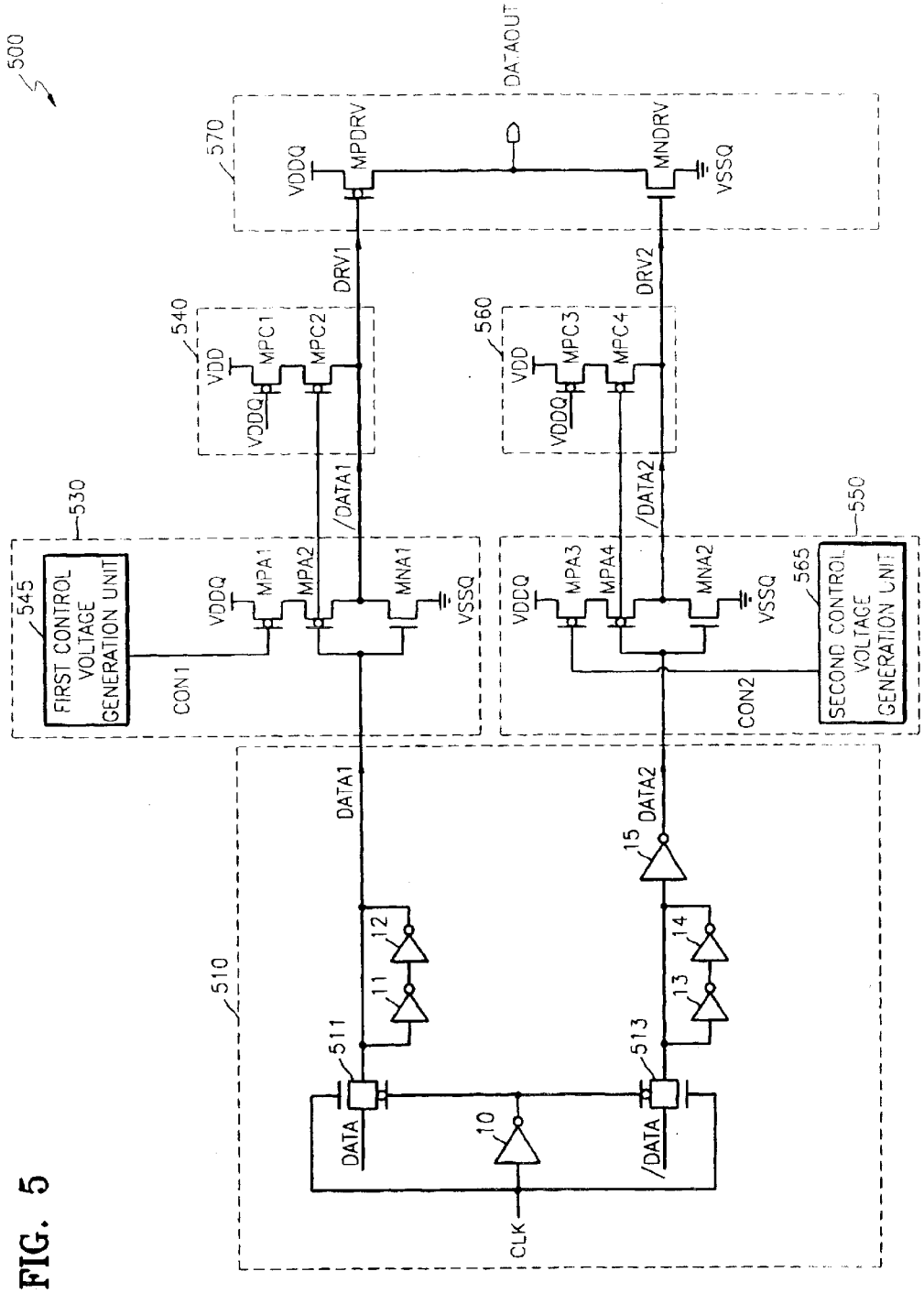
FIG. 5 is a circuit diagram of a data output circuit according to a second embodiment of the present invention.
Figure 6A:
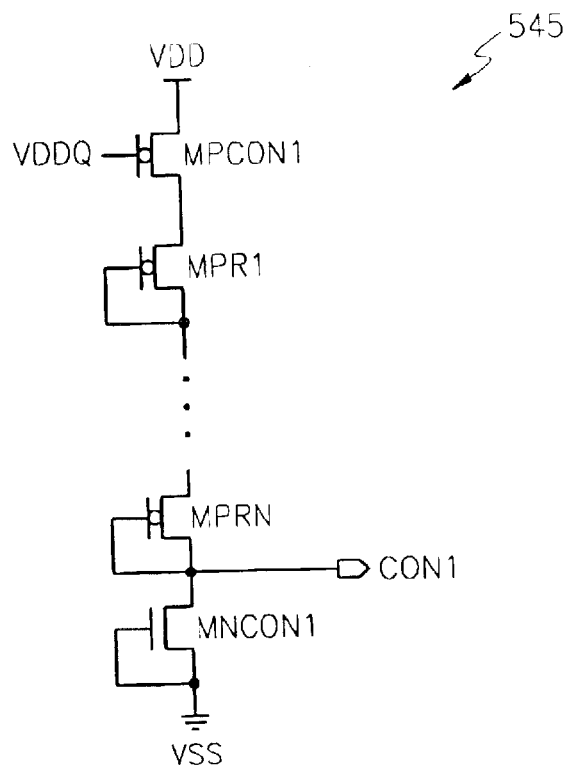
FIGS. 6A and 6B are circuit diagrams of the first and second control voltage generation units of FIG. 5.
Figure 6B:
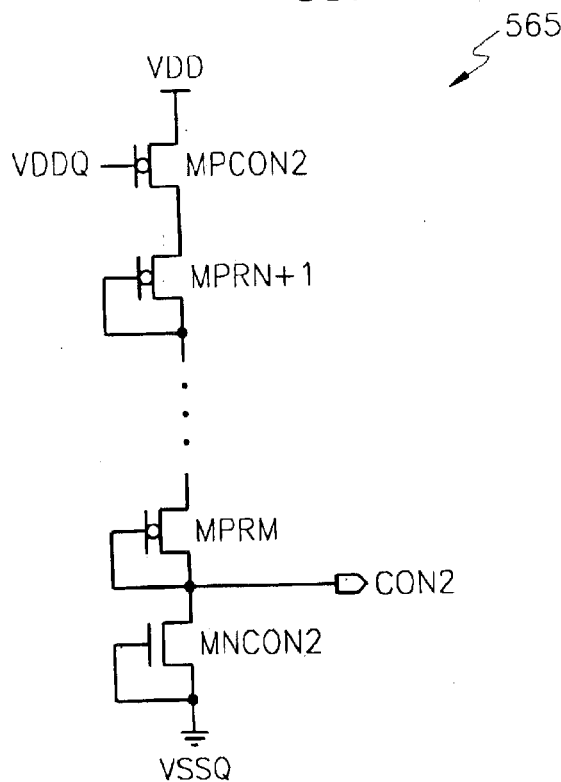

FIG. 5 is a circuit diagram of a data output circuit according to a second embodiment of the present invention. FIGS. 6A and 6B are circuit diagrams of the first and second control voltage generation units of FIG. 5.

Referring to FIGS. 5, 6A, and 6B, a data output circuit 500 according to a second embodiment of the present invention includes a first inversion unit 530, a first voltage compensation unit 540, a second inversion unit 550, a second voltage compensation unit 560, and a driver unit 570.

If the output voltage level of the first power supply voltage VDDQ is equal to the operating voltage level of the second power supply voltage VDD, the first inversion unit 530 receives a first data signal DATA1 with an operating voltage level and inverts the received signal to generate a first inverted data signal DATA1.

To be more specific, the first inversion unit 530 includes first and second PMOS transistors MPA1 and MPA2, a first inversion NMOS transistor MNA1, and a first control voltage generation unit 545.

The source of the first inversion PMOS transistor MPA1 is connected to the first power supply voltage VDDQ, and a first control voltage CON1 is applied to the gate of the first inversion PMOS transistor MPA1. The source of the second inversion PMOS transistor MPA2 is connected to the drain of the first inversion PMOS transistor MPA1, and a first data signal DATA1 is applied to the gate of the second inversion PMOS transistor MPA2. The drain of the second inversion PMOS transistor MPA2 generates a first inverted data signal DATA1.

The drain of the first inversion NMOS transistor MNA1 is connected to the drain of the second inversion PMOS transistor MPA2, and the first data signal DATA1 is applied to the gate of the first inversion NMOS transistor MNA1. The source of the first inversion NMOS transistor MNA1 is connected to a first ground voltage VSSQ.

If the levels of the first and second power supply voltages VDDQ and VDD are the same, the first control voltage generation unit 545 generates a first control voltage CON1 with a first logic level. If the level of the second power supply voltage VDD is a predetermined level smaller than that of the first power supply voltage VDDQ, the first control voltage generation unit 545 generates a first control voltage CON1 with a second logic level.

The first control voltage generation unit 545 includes a first control PMOS transistor MPCON1, first through N-th load PMOS transistors MPR1 through MPRN, and a first control NMOS transistor MNCON1.

The source of the first control PMOS transistor MPCON1 is connected to a second power supply voltage VDD, and a first power supply voltage VDDQ is applied to the gate of the first control PMOS transistor MPCON1. The first through N-th load PMOS transistors MPR1 through MPRN are serially connected to the first control PMOS transistor MPCON1.

The first control NMOS transistor MNCON1 is connected between the N-th load PMOS transistor MPRN and a second ground voltage VSS, and generates the first control voltage CON1 via its drain. The source and gate of the first control NMOS transistor MNCON1 are connected to each other.

If the difference between the levels of the first and second power supply voltages VDDQ and VDD is equal to or greater than a predetermined voltage level, the first voltage compensation unit 540 compensates for the voltage level of the first inverted data signal DATA1 to generate a first driving signal DRV1.

The first voltage compensation unit 540 includes first and second compensation PMOS transistors MPC1 and MPC2. The source of the first compensation PMOS transistor MPC1 is connected to the second power supply voltage VDD. The first power supply voltage VDDQ is applied to the gate of the first compensation PMOS transistor MPC1.

The source of the second compensation PMOS transistor MPC2 is connected to the drain of the first compensation PMOS transistor MPC1. The first data signal DATA1 is applied to the gate of the second compensation PMOS transistor MPC2. The drain of the second compensation PMOS transistor MPC2 is connected to a connection node between the second inversion PMOS transistor MPA2 and the first inversion NMOS transistor MNA1.

If the first and second power supply voltages VDDQ and VDD are different by at least a threshold voltage level of the first compensation PMOS transistor MPC1, the first voltage compensation unit 540 compensates for the voltage level of the first inverted data signal DATA1.

A buffer logic unit 510 for buffering a data signal DATA and an inverted data signal /DATA in response to a clock signal CLK and then outputting first and second data signals DATA1 and DATA2 is shown in FIG. 5.

If the level of a first power supply voltage VDDQ is equal to that of a second power supply voltage VDD, the second inversion unit 550 receives a second data signal DATA2 with an operating voltage level and inverts the received signal DATA2 to generate a second inverted data signal /DATA2.

The second inversion unit 550 includes third and fourth PMOS transistors MPA3 and MPA4, a second inversion NMOS transistor MNA2, and a second control voltage generation unit 565.

The source of the third inversion PMOS transistor MPA3 is connected to the first power supply voltage VDDQ, and a second control voltage CON2 is applied to the gate of the third inversion PMOS transistor MPA3. The source of the fourth inversion PMOS transistor MPA4 is connected to the drain of the third inversion PMOS transistor MPA3, and a second data signal DATA2 is applied to the gate of the fourth inversion PMOS transistor MPA4. The drain of the fourth inversion PMOS transistor MPA4 generates a second inverted data signal /DATA2.

The drain of the second inversion NMOS transistor MNA2 is connected to the drain of the fourth inversion PMOS transistor MPA4, and the second data signal DATA2 is applied to the gate of the second inversion NMOS transistor MNA2. The source of the second inversion NMOS transistor MNA2 is connected to a first ground voltage VSSQ.

If the levels of the first and second power supply voltages VDDQ and VDD are the same, the second control voltage generation unit 565 generates a first control voltage CON1 with a first logic level. If the level of the second power supply voltage VDD is a predetermined level smaller than that of the first power supply voltage VDDQ, the second control voltage generation unit 565 generates a second control voltage CON2 with a second logic level.

To be more specific, the second control voltage generation unit 565 includes a second control PMOS transistor MPCON2, (N+1) through M-th load PMOS transistors MPRN+1 through MPRM, and a second control NMOS transistor MNCON2.

The source of the second control PMOS transistor MPCON2 is connected to a second power supply voltage VDD, and a first power supply voltage VDDQ is applied to the gate of the second control PMOS transistor MPCON2. The (N+1)th through M-th load PMOS transistors MPRN+1 through MPRM are serially connected to the second control PMOS transistor MPCON2.

The second control NMOS transistor MNCON2 is connected between the M-th load PMOS transistor MPRM and a second ground voltage VSS and generates the second control voltage CON2 via its drain. The source and gate of the second control NMOS transistor MNCON2 are connected to each other.

If the difference between the levels of the first and second power supply voltages VDDQ and VDD is equal to or greater than a predetermined voltage level, the second voltage compensation unit 560 compensates for the voltage level of the second inverted data signal DATA2 to generate a second driving signal DRV2.

To be more specific, the second voltage compensation unit 560 includes third and fourth compensation PMOS transistors MPC3 and MPC4. The source of the third compensation PMOS transistor MPC3 is connected to the second power supply voltage VDD. The first power supply voltage VDDQ is applied to the gate of the third compensation PMOS transistor MPC3. The source of the fourth compensation PMOS transistor MPC4 is connected to the drain of the third compensation PMOS transistor MPC3. The second data signal DATA2 is applied to the gate of the fourth compensation PMOS transistor MPC4. The drain of the fourth compensation PMOS transistor MPC4 is connected to a connection node between the fourth inversion PMOS transistor MPA4 and the second inversion NMOS transistor MNA2.

If the first and second power supply voltages VDDQ and VDD are different by at least a threshold voltage level of the third compensation PMOS transistor MPC3, the second voltage compensation unit 560 compensates for the voltage level of the second inverted data signal /DATA2.

The driver unit 570 receives the first and second driving signals DRV1 and DRV2 and outputs an output data signal DATAOUT with a logic level that is opposite to the logic levels of the first and second driving signals DRV1 and DRV2.

Since the operation of the buffer logic unit 510 is the same as the above-described operation of the buffer logic unit 310 of FIG. 3, it will not be described.

The data output circuit 500 of FIG. 5 according to the second embodiment of the present invention is different from the data output circuit 300 according to the first embodiment of the present invention in that the structure and operation of the first and second inversion units 530 and 550 are different from those of the counterparts of the data output circuit 300 of FIG. 3. Hence, the first and second inversion units 530 and 550 will be focused on in describing the data output circuit 500 of FIG. 5.

If the levels of the first and second power supply voltages VDDQ and VDD are the same, or if the different between the levels of the first and second power supply voltages VDDQ and VDD is equal to or greater than the threshold voltage level of the first control PMOS transistor MPCON1, the first control PMOS transistor MPCON1 is turned off.

Then, the first control NMOS transistor MNCON1 turned on constantly maintains the level of the first control voltage CON1 at a first logic level, that is, a low logic level.

The first control voltage CON1 with a low level turns on the first inversion PMOS transistor MPA1. If the first data signal DATA1 is at a low level, the second inversion PMOS transistor MPA2 is also turned on, thus the first inversion unit 530 generates a first inversion data signal DATA1 with the level of the first power supply voltage VDDQ.

Since the level of the first power supply voltage VDDQ is equal to the operating voltage level of the second power supply voltage VDD or different by at most the threshold voltage level of the first control PMOS transistor MPCON1, the slope of the first driving signal DRV1 is not gentle, and the output data signal DATAOUT is not skewed.

Since the level of the first power supply voltage VDDQ is equal to the operating voltage level of the second power supply voltage VDD or different by at most the threshold voltage level of the first control PMOS transistor MPCON1, the first compensation PMOS transistor MPC1 is turned off, and the first voltage compensation unit 540 does not operate.

If the level of the first power supply voltage VDDQ is less than that of the second power supply voltage VDD by at most the threshold voltage level of the first control PMOS transistor MPCON1, the first control PMOS transistor MPCON1 is turned on, and the first control voltage CON1 is generated at a second logic level, that is, a high level.

The voltage level of the first control voltage CON1 can be controlled by the first through N-th load PMOS transistors MPR1 through MPRN. If the first control voltage CON1 is generated having a high level, the first inversion PMOS transistor MPA1 is turned off.

However, the first compensation PMOS transistor MPC1 of the first voltage compensation unit 540 is turned on. If the first data signal DATA1 has a low level, the second compensation PMOS transistor MPC2 is also turned on, thus the level of the first inversion data signal /DATA1 becomes equal to that of the second power supply voltage VDD.

Hence, the slope of the first driving signal DRV1 is not slow, and the output data signal DATAOUT is not skewed.

The first control voltage CON1 operates in connection with the operation of the first compensation PMOS transistor MPC1 of the first voltage compensation unit 540. That is, the first inversion PMOS transistor MPA1 is turned off for a duration as long as the first compensation PMOS transistor MPC1 is turned on. The first inversion PMOS transistor MPA1 is turned off for a duration as long as the first compensation PMOS transistor MPC1 is turned off.

Since the circuit structures and operations of the second inversion unit 550 and the second voltage compensation unit 560 are the same as those of the first inversion unit 530 and the first voltage compensation unit 540, respectively, they will not be described in detail.

Figure 7:
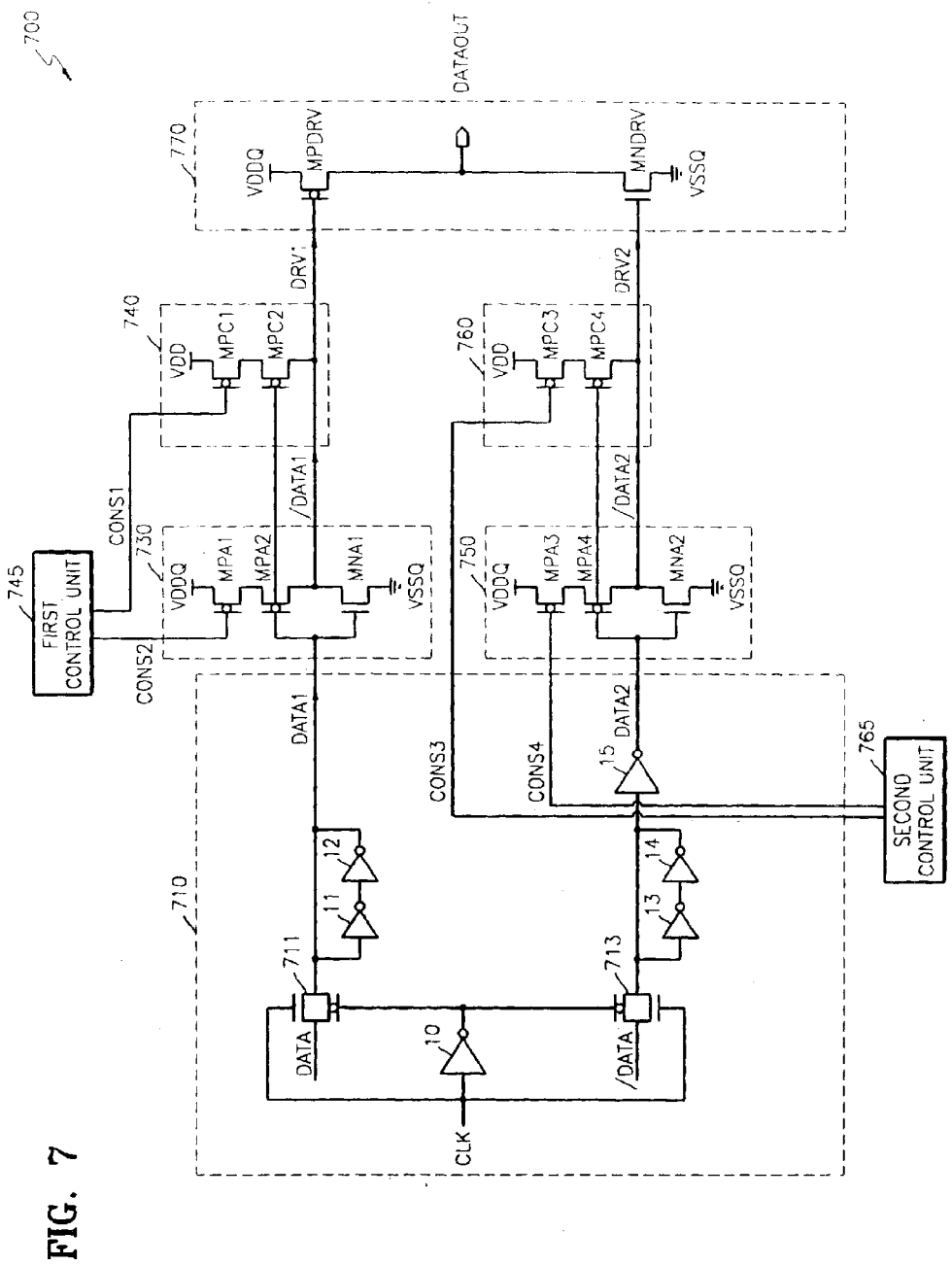
FIG. 7 is a circuit diagram of a data output circuit according to a third embodiment of the present invention.
Figure 8A:
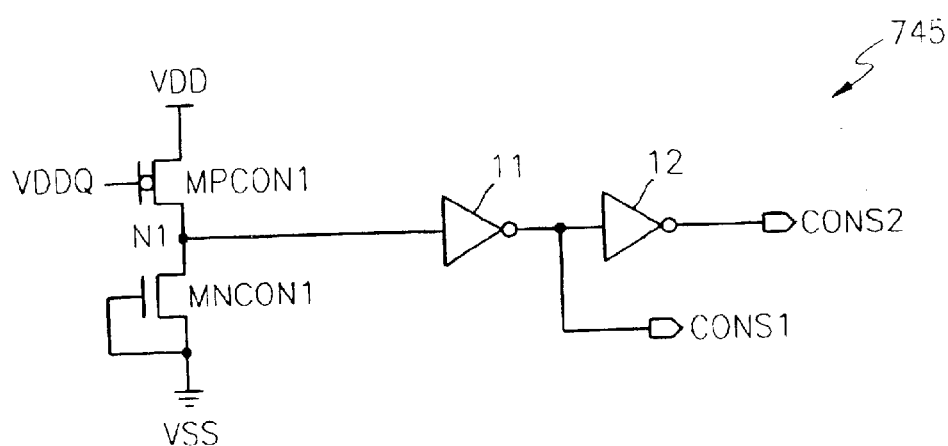
FIGS. 8A and 8B are circuit diagrams of the first and second control units of FIG. 7.
Figure 8B:
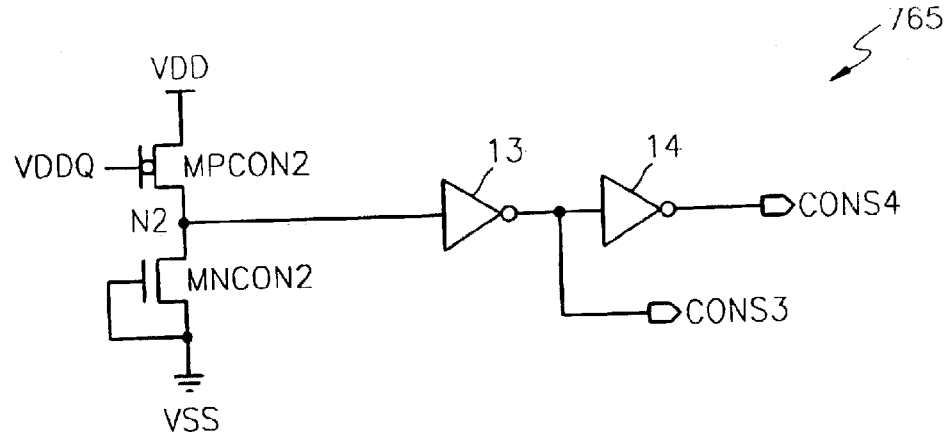

FIG. 7 is a circuit diagram of a data output circuit according to a third embodiment of the present invention. FIGS. 8A and 8B are circuit diagrams of the first and second control units of FIG. 7.

Referring to FIGS. 7, 8A, and 8B, a data output circuit 700 according to a third embodiment of the present invention includes a first inversion unit 730, a first voltage compensation unit 740, a first control unit 745, a second inversion unit 750, a second voltage compensation unit 760, a second control unit 765, and a driver unit 770.

If an output voltage level of a first power supply voltage VDDQ is equal to an operating voltage level of a second power supply voltage VDD, the first inversion unit 730 receives a first data signal DATA1 with an operating voltage level and inverts the received signal to generate a first inverted data signal /DATA1.

To be more specific, the first inversion unit 730 includes first and second PMOS transistors MPA1 and MPA2 and a first inversion NMOS transistor MNA1.

The source of the first inversion PMOS transistor MPA1 is connected to the first power supply voltage VDDQ, and a first control signal CONS2 is applied to the gate of the first inversion PMOS transistor MPA1. The source of the second inversion PMOS transistor MPA2 is connected to the drain of the first inversion PMOS transistor MPA1, and a first data signal DATA1 is applied to the gate of the second inversion PMOS transistor MPA2. The drain of the second inversion PMOS transistor MPA2 generates a first inverted data signal /DATA1.

The drain of the first inversion NMOS transistor MNA1 is connected to the drain of the second inversion PMOS transistor MPA2, and the first data signal DATA1 is applied to the gate of the first inversion NMOS transistor MNA1. The source of the first inversion NMOS transistor MNA1 is connected to a first ground voltage VSSQ.

If the levels of the first and second power supply voltages VDDQ and VDD are different by at least a predetermined voltage level, the first control voltage compensation unit 740 compensates for the voltage level of the first inverted data signal /DATA1 to generate a first driving signal DRV1.

The first voltage compensation unit 740 includes first and second compensation PMOS transistors MPC1 and MPC2. The source of the first compensation PMOS transistor MPC1 is connected to the second power supply voltage VDD. The first control signal CONS1 is applied to the gate of the first compensation PMOS transistor MPC1. The source of the second compensation PMOS transistor MPC2 is connected to the drain of the first compensation PMOS transistor MPC1. The first data signal DATA1 is applied to the gate of the second compensation PMOS transistor MPC2. The drain of the second compensation PMOS transistor MPC2 is connected to a connection node between the second inversion PMOS transistor MPA2 and the first inversion NMOS transistor MNA1.

The first control unit 745 generates a first control signal CONS1 that controls the operation of the first voltage compensation unit 740, if the levels of the first and second power supply voltages VDDQ and VDD are the same. On the other hand, if the difference between the levels of the first and second power supply voltage VDDQ and VDD is equal to or greater than a predetermined voltage level, the first control unit 745 generates the second control voltage CONS2 that controls the operation of the first inversion unit 730.

The first control unit 745 includes a first control PMOS transistor MPCON1, a first control NMOS transistor MNCON1, and first and second inverters I1 and I2.

The source of the first control PMOS transistor MPCON1 is connected to a second power supply voltage VDD, and a first power supply voltage VDDQ is applied to the gate of the first control PMOS transistor MPCON1. The drain of the first control NMOS transistor MNCON1 is connected to the drain of the first control PMOS transistor MPCON1, and the source and gate thereof are connected to a second ground voltage VSS.

The first inverter I1 is connected between a connection node N1 between the first control PMOS transistor MPCON1 and the first control NMOS transistor MNCON1 and generates the first control signal CONS1. The second inverter I2 is connected to the first inverter I1 and generates the second control signal CONS2.

If the levels of the first and second power supply voltages VDDQ and VDD are the same, the second inversion unit 750 receives a second data signal DATA2 with an operating voltage level and inverts the received signal DATA2 to generate a second inverted data signal DATA2.

The second inversion unit 750 includes third and fourth PMOS transistors MPA3 and MPA4 and a second inversion NMOS transistor MNA2.

The source of the third inversion PMOS transistor MPA3 is connected to the first power supply voltage VDDQ, and a fourth control signal CONS4 is applied to the gate of the third inversion PMOS transistor MPA3. The source of the fourth inversion PMOS transistor MPA4 is connected to the drain of the third inversion PMOS transistor MPA3, and a second data signal DATA2 is applied to the gate of the fourth inversion PMOS transistor MPA4. The drain of the fourth inversion PMOS transistor MPA4 generates a second inverted data signal /DATA2.

The drain of the second inversion NMOS transistor MNA2 is connected to the drain of the fourth inversion PMOS transistor MPA4, and the second data signal DATA2 is applied to the gate of the second inversion NMOS transistor MNA2. The source of the second inversion NMOS transistor MNA2 is connected to a first ground voltage VSSQ.

If the levels of the first and second power supply voltages VDDQ and VDD are different by at least a predetermined voltage level, the second voltage compensation unit 760 compensates for the voltage level of the second inverted data signal DATA2 to generate a second driving signal DRV2.

To be more specific, the second voltage compensation unit 760 includes third and fourth compensation PMOS transistors MPC3 and MPC4. The source of the third compensation PMOS transistor MPC3 is connected to the second power supply voltage VDD. A third control signal CONS3 is applied to the gate of the third compensation PMOS transistor MPC3. The source of the fourth compensation PMOS transistor MPC4 is connected to the drain of the third compensation PMOS transistor MPC3. The second data signal DATA2 is applied to the gate of the fourth compensation PMOS transistor MPC4. The drain of the fourth compensation PMOS transistor MPC4 is connected to a connection node between the fourth inversion PMOS transistor MPA4 and the second inversion NMOS transistor MNA2.

The second control unit 765 generates a third control signal CONS3 that controls the operation of the second voltage compensation unit 760, if the levels of the first and second power supply voltages VDDQ and VDD are the same. On the other hand, if the difference between the levels of the first and second power supply voltage VDDQ and VDD is equal to or greater than a predetermined voltage level, the second control unit 765 generates the fourth control voltage CONS4 that controls the operation of the second inversion unit 750.

The second control unit 765 includes a second control PMOS transistor MPCON2, a second control NMOS transistor MNCON2, and third and fourth inverters I3 and I4.

The source of the second control PMOS transistor MPCON2 is connected to a second power supply voltage VDD, and a first power supply voltage VDDQ is applied to the gate of the first control PMOS transistor MPCON1. The drain of the second control NMOS transistor MNCON2 is connected to the drain of the second control PMOS transistor MPCON2, and the source and gate thereof are connected to a second ground voltage VSS.

The third inverter I3 is connected between a connection node N2 between the second control PMOS transistor MPCON2 and the second control NMOS transistor MNCON2 and generates the third control signal CONS3. The fourth inverter I4 is connected to the third inverter I3 and generates the fourth control signal CONS4.

The driver unit 770 receives the first and second driving signals DRV1 and DRV2 and outputs an output data signal DATAOUT with a logic level that is opposite to the logic levels of the first and second driving signals DRV1 and DRV2.

The data output circuit 700 of FIG. 7 according to the third embodiment of the present invention includes the first control unit 745 that generates the first and second control signals CONS1 and CONS2 for controlling the first inversion unit 730 and the first voltage compensation unit 740, respectively, and the second control unit 765 that generates the third and fourth control signals CONS3 and CONS4 for controlling the second inversion unit 750 and the second voltage compensation unit 760, respectively.

The first and second control signals CONS1 and CONS2 have opposite phases. If the levels of the first and second power supply voltages VDDQ and VDD are the same, the second control signal CONS2 is generated having a low level, and the first control signal CONS1 is generated having a high level.

If the levels of the first and second power supply voltages VDDQ and VDD are different, that is, if the level of the first power supply voltage VDDQ is less than that of the second power supply voltage VDD by at least the threshold voltage level of the first control PMOS transistor MPCON1, the second control signal CONS2 is generated having a high level, and the first control signal CONS1 is generated having a low level.

If the first and second control signals CONS1 and CONS2 are generated having a high level and a low level, respectively, because the first and second power supply voltages VDDQ and VDD are the same, the first inversion PMOS transistor MPA1 of the first inversion unit 730 is turned on, and the first compensation PMOS transistor MPC1 of the first voltage compensation unit 740 is turned off. Hence, the first voltage compensation unit 740 does not operate.

If the first data signal DATA1 is in a low level, the second inversion PMOS transistor MPA2 is turned on, and then the first inversion data signal /DATA1 is activated to the level of the first power supply voltage VDDQ. Since the level of the first power supply voltage VDDQ is equal to the level of the second power supply voltage VDD, the slope of the first driving signal DRV1 is prevented from being slow, and the output data signal DATAOUT is not skewed.

When the first and second control signals CONS1 and CONS2 are generated having a low level and a high level, respectively, because the level of the first power supply voltage VDDQ is less than that of the second power supply voltage VDD by at least the threshold voltage level of the first control PMOS transistor MPCON1, the first inversion PMOS transistor MPA1 of the first inversion unit 730 is turned off, and the first compensation PMOS transistor MPC1 of the first voltage compensation unit 740 is turned on. Hence, the first inversion unit 730 does not operate.

If the first data signal DATA1 is in a low level, the second compensation PMOS transistor MPC2 is turned on, and then the first inversion data signal /DATA1 is activated to the level of the second power supply voltage VDD. The first driving signal DRV1 is also activated to the level of the second power supply voltage VDD. Therefore, the slope of the first driving signal DRV1 is prevented from being slow, and the output data signal DATAOUT is not skewed.

If the level of the first power supply voltage VDDQ is less than that of the second power supply voltage VDD by at least the threshold voltage level of the first control PMOS transistor MPCON1, the first control PMOS transistor MPCON1 of the first control unit 745 of FIG. 8 is turned on, and the connection node N1 has the level of the second power supply voltage VDD. Also, the first and second control signals CONS1 and CONS2 have a low level and a high level, respectively.

If the levels of the first and second power supply voltages VDDQ and VDD are the same, the first control PMOS transistor MPCON1 is turned off, and the connection node N1 enters into a floating state.

However, the voltage level of the connection node N1 is decreased by the first control NMOS transistor MNCON1 and finally becomes the threshold voltage level of the first control NMOS transistor MNCON1. The first and second control signals CONS1 and CONS2 have a high level and a low level respectively.

Since the circuit structures and operations of the second inversion unit 750, the second voltage compensation unit 760, and the second control unit 765 are the same as those of the second inversion unit 750, the second voltage compensation unit 760, and the second control unit 765, they will not be described in detail.

The data output circuit 700 according to the third embodiment of FIG. 7 can select a power supply voltage for compensating for the voltage level of the first inversion data signal /DATA1, using the first and second control signals CONS1 and CONS2, if the levels of the first and second power supply voltages VDDQ and VDD are the same or different by less than a predetermined voltage level.

The data output circuit 700 can also select a power supply voltage for compensating for the voltage level of the second inversion data signal /DATA2, using the third and fourth control signals CONS3 and CONS4, if the levels of the first and second power supply voltages VDDQ and VDD are different by at least a predetermined voltage level.

Hence, a skewing error generated in the output data signal DATAOUT can be minimized regardless of a change in the voltage level of the first power supply voltage VDDQ.

As described above, a data output circuit according to the present invention automatically recognizes a change in the voltage level of a power supply voltage that is different from an operating voltage level, thereby minimizing skewing error generated in an output data signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A data output circuit comprising:
    a first inversion unit receiving, at an input thereof, a first data signal of an operating voltage level and inverting the received first data signal to obtain, at an output thereof, a first inverted data signal;
    a first voltage compensation unit coupled to the output of the first inversion unit, that compensates for the voltage level of the first inverted data signal to obtain a first driving signal, when a first power supply voltage of an output voltage level is different from a second power supply voltage of the operating voltage level by at least a predetermined voltage level;
    a second inversion unit receiving, at an input thereof, a second data signal with the operating voltage level and inverting the received second data signal to obtain, at an output thereof, a second inverted data;
    a second voltage compensation unit coupled to the output of the second inversion unit, that compensates for the voltage level of the second inverted data signal to obtain a second driving signal, when the levels of the first and second power supply voltages are different by at least a predetermined voltage level; and
    a driver unit receiving the first and second driving signals and outputting an output data signal of a logic level that is opposite the logic levels of the first and second driving signals.

2. The data output circuit of claim 1, wherein the first inversion unit forms an inverter comprising a first PMOS transistor and a first NMOS transistor serially connected between the first power supply voltage and a first ground voltage of the output voltage level, and wherein the first data signal is applied to a gate of the first PMOS transistor and a gate of the first NMOS transistor.

3. The data output circuit of claim 1, wherein the second inversion unit forms an inverter comprising a second PMOS transistor and a second NMOS transistor serially connected between the first power supply voltage and a first ground voltage of the output voltage level, and wherein the second data signal is applied to a gate of the second PMOS transistor and a gate of the second NMOS transistor.

4. The data output circuit of claim 1, wherein the first voltage compensation unit comprises:
- a first compensation PMOS transistor, a source of which is connected to the second power supply voltage and a gate of which is subjected to the first power supply voltage; and
- a second compensation PMOS transistor, a source of which is connected to the drain of the first compensation PMOS transistor, a gate of which is subjected to the first data signal, and a drain of which is connected to a connection node between the first PMOS transistor and the first NMOS transistor.

5. The data output circuit of claim 4, wherein the first voltage compensation unit compensates for the voltage level of the first inverted data signal when the first and second power supply voltages are different by at least a threshold voltage level of the first compensation PMOS transistor.

6. The data output circuit of claim 1, wherein the second voltage compensation unit comprises:
- a third compensation PMOS transistor, a source of which is connected to the second power supply voltage and a gate of which is subjected to the first power supply voltage; and
- a fourth compensation PMOS transistor, a source of which is connected to the drain of the third compensation PMOS transistor, a gate of which is subjected to the second data signal, and a drain of which is connected to a connection node between the second PMOS transistor and the second NMOS transistor.

7. The data output circuit of claim 6, wherein the second voltage compensation unit compensates for the voltage level of the second inverted data signal when the first and second power supply voltages are different by at least a threshold voltage level of the third compensation PMOS transistor.

8. The data output circuit of claim 1, wherein the first and second data signals have the same level.

9. The data output circuit of claim 1, wherein the first voltage compensation unit comprises:
- a first compensation PMOS transistor, a source of which is connected to the second power supply voltage and a gate of which is subjected to a first drop voltage;
- a second compensation PMOS transistor, a source of which is connected to the drain of the first compensation PMOS transistor, a gate of which is subjected to the first data signal, and a drain of which is connected to a connection node between the first PMOS transistor and the first NMOS transistor;
- first through N-th load PMOS transistors serially connected to the first power supply voltage; and
- a first load NMOS transistor connected between the N-th load PMOS transistor and a second ground voltage, a drain of which generates the first drop voltage and a gate and a source of which are connected to each other.

10. The data output circuit of claim 9, wherein the first voltage compensation unit compensates for the voltage level of the first inverted data signal when the second power supply voltage and the first drop voltage are different by at least the threshold voltage level of the first compensation PMOS transistor, and the level of the first drop voltage is determined according to the number of first through N-th load PMOS transistors.

11. The data output circuit of claim 1, wherein the second voltage compensation unit comprises:
- a third compensation PMOS transistor, a source of which is connected to the second power supply voltage and a gate of which is subjected to a second drop voltage;
- a fourth compensation PMOS transistor, a source of which is connected to the drain of the third compensation PMQS transistor, a gate of which is subjected to the second data signal, and a drain of which is connected to a connection node between the second PMOS transistor and the second NMOS transistor;
- (N+1)th through M-th load PMOS transistors serially connected to the first power supply voltage; and
- a second load NMOS transistor connected between the M-th load PMOS transistor and a second ground voltage, a drain of which generates the second drop voltage and a gate and a source of which are connected to each other.

12. The data output circuit of claim 11, wherein the second voltage compensation unit compensates for the voltage level of the second inverted data signal when the second power supply voltage and the second drop voltage are different by at least the threshold voltage level of the third compensation PMOS transistor, and the level of the second drop voltage is determined according to the number of (N+1)th through M-th load PMOS transistors.

13. A data output circuit comprising:
- a first inversion unit receiving, at an input thereof, a first data signal of an operating voltage level and inverting the received first data signal to obtain, at an output thereof, a first inverted data signal, when an output voltage level of a first power supply voltage is equal to an operating voltage level of a second power supply voltage;
- a first voltage compensation unit coupled to the output of the first inversion unit, that compensates for the voltage level of the first inverted data signal to obtain a first driving signal, when the first power supply voltage of the output voltage level is different from the second power supply voltage of the operating voltage level is different by at least a predetermined voltage level;
- a second inversion unit receiving, at an input thereof, a second data signal of the operating voltage level and inverting the received second data signal to obtain, at an output thereof, a second inverted data signal, when the levels of the first and second power supply voltages are the same;
- a second voltage compensation unit coupled to the output of the second inversion unit, that compensates for the voltage level of the second inverted data signal to obtain a second driving signal, when the levels of the first and second power supply voltages are different by at least a predetermined voltage level; and
- a driver unit receiving the first and second driving signals and outputting an output data signal of a logic level that is opposite the logic levels of the first and second driving signals.

14. The data output circuit of claim 13, wherein the first inversion unit comprises:

a first inversion PMOS transistor, a source of which is connected to the first power supply voltage and a gate of which is subjected to a first control voltage;

a second inversion PMOS transistor, a source of which is connected to the drain of the first inversion PMOS transistor, a gate of which is subjected to the first data signal, and a drain of which generates the first inverted data signal;

a first inversion NMOS transistor, a drain of which is connected to the drain of the second inversion PMOS transistor, a gate of which is subjected to the first data signal, and a source of which is connected to a first ground voltage; and a first control voltage generation unit generating the first control voltage to have a first logic level, when the levels of the first and second power supply voltages are the same, and generating the first control voltage to have a second logic level, when the level of the first power supply voltage is less than that of the second power supply voltage by a predetermined voltage level.

15. The data output circuit of claim 14, wherein the first control voltage generation unit comprises:

a first control PMOS transistor, a source of which is connected to the second power supply voltage and a gate of which is subjected to the first power supply voltage;

first through N-th load PMOS transistors serially connected to the first control PMOS transistor; and a first control NMOS transistor connected between the N-th load PMOS transistor and a second ground voltage, a drain of which generates the first control voltage and a gate and a source of which are connected to each other.

16. The data output circuit of claim 13, wherein the first voltage compensation unit comprises:

a first compensation PMOS transistor, a source of which is connected to the second power supply voltage and a gate of which is subjected to the first power supply voltage; and a second compensation PMOS transistor, a source of which is connected to the drain of the first compensation PMOS transistor, a gate of which is subjected to the first data signal, and a drain of which is connected to a connection node between the second inversion PMOS transistor and the first inversion NMOS transistor.

17. The data output circuit of claim 16, wherein the first voltage compensation unit compensates for the voltage level of the first inverted data signal when the first and second power supply voltages are different by at least a threshold voltage level of the first compensation PMOS transistor.

18. The data output circuit of claim 13, wherein the second inversion unit comprises:

a third inversion PMOS transistor, a source of which is connected to the first power supply voltage and a gate of which is subjected to a second control voltage;

a fourth inversion PMOS transistor, a source of which is connected to the drain of the third inversion PMOS transistor, a gate of which is subjected to the second data signal, and a drain of which generates the second inverted data signal;

a second inversion NMOS transistor, a drain of which is connected to the drain of the fourth inversion PMOS transistor, a gate of which is subjected to the second data signal, and a source of which is connected to a first ground voltage; and a second control voltage generation unit generating the second control voltage to have a first logic level, when the levels of the first and second power supply voltages are the same, and generating the second control voltage to have a second logic level, when the level of the first power supply voltage is less than that of the second power supply voltage by a predetermined voltage level.

19. The data output circuit of claim 18, wherein the second control voltage generation unit comprises:

a second control PMOS transistor, a source of which is connected to the second power supply voltage and a gate of which is subjected to the first power supply voltage;

(N+1)th through M load PMOS transistors serially connected to the second control PMOS transistor; and a second control NMOS transistor connected between the M-th load PMOS transistor and a second ground voltage, a drain of which generates the second control voltage and a gate and source of which are connected to each other.

20. The data output circuit of claim 13, wherein the second voltage compensation unit comprises:

a third compensation PMQS transistor, a source of which is connected to the second power supply voltage and a gate of which is subjected to the first power supply voltage; and a fourth compensation PMOS transistor, a source of which is connected to the drain of the third compensation PMOS transistor, a gate of which is subjected to the second data signal, and a drain of which is connected to a connection node between the fourth inversion PMOS transistor and the second inversion NMOS transistor.

21. The data output circuit of claim 20, wherein the second voltage compensation unit compensates for the voltage level of the second inverted data signal when the first and second power supply voltages are different by at least a threshold voltage level of the third compensation PMOS transistor.

22. The data output circuit of claim 13, wherein the first and second data signals have the same level.

23. A data output circuit comprising:

a first inversion unit receiving a first data signal of an operating voltage level and inverting the received first data signal to obtain a first inverted data signal, when an output voltage level of a first power supply voltage is equal to an operating voltage level of a second power supply voltage;

a first voltage compensation unit compensating for the voltage level of the first inverted data signal to obtain a first driving signal, when the levels of the first and second power supply voltages are different by at least a predetermined voltage level;

a first control unit generating a first control signal for controlling the operation of the first voltage compensation unit when the levels of the first and second power supply voltages are the same and generating a second control signal for controlling the operation of the first inversion unit when the levels of the first and second power supply voltages are different by at least a predetermined voltage level;

a second inversion unit receiving a second data signal of an operating voltage level and inverting the received second data signal to obtain a second inverted data signal, when the levels of the first and second power supply voltages are the same;

a second voltage compensation unit compensating for the voltage level of the second inverted data signal to obtain a second driving signal, when the levels of the first and second power supply voltages are different by at least a predetermined voltage level;

a second control unit generating a third control signal for controlling the operation of the second voltage compensation unit when the levels of the first and second power supply voltages are the same and generating a fourth control signal for controlling the operation of the second inversion unit when the levels of the first and second power supply voltages are different by at least a predetermined voltage level; and a driver unit receiving the first and second diving signals and outputting an output data signal at a logic level that is opposite to the logic levels of the first and second driving signals.

24. The data output circuit of claim 23, wherein the first inversion unit comprises:

a first inversion PMOS transistor, a source of which is connected to the first power supply voltage and a gate of which is subjected to the second control signal;

a second inversion PMOS transistor, a source of which is connected to the drain of the first inversion PMOS transistor, a gate of which is subjected to the first data signal, and a drain of which generates the first inverted data signal; and a first inversion NMOS transistor, a drain of which is connected to the drain of the second inversion PMOS transistor, a gate of which is subjected to the first data signal, and a source of which is connected to a first ground voltage.

25. The data output circuit of claim 23, wherein the first control unit comprises:

a first control PMOS transistor, a source of which is connected to the second power supply voltage and a gate of which is subjected to the first power supply voltage;

a first control NMOS transistor, a drain of which is connected to the drain of the first control PMOS transistor, and a gate and source of which are connected to a second ground voltage;

a first inverter connected to a connection node between the first control PMOS transistor and the first control NMOS transistor, generating the first control signal; and a second inverter connected to the first inverter, generating the second control signal.

26. The data output circuit of claim 23, wherein the first voltage compensation unit comprises:

a first compensation PMOS transistor, a source of which is connected to the second power supply voltage and a gate of which is subjected to the first control signal; and a second compensation PMOS transistor, a source of which is connected to the drain of the first compensation PMOS transistor, a gate of which is subjected to the first data signal, and a drain of which is connected to a connection node between the second inversion PMOS transistor and the first inversion NMOS transistor.

27. The data output circuit of claim 23, wherein the second inversion unit comprises:

a third inversion PMOS transistor, a source of which is connected to the first power supply voltage and a gate of which is subjected to a fourth control signal;

a fourth inversion PMOS transistor, a source of which is connected to the drain of the third inversion PMOS transistor, a gate of which is subjected to the second data signal, and a drain of which generates the second inverted data signal; and a second inversion NMOS transistor, a drain of which is connected to the drain of the fourth inversion PMOS transistor, a gate of which is subjected to the second data signal, and a source of which is connected to a first ground voltage.

28. The data output circuit of claim 23, wherein the second control unit comprises:

a second control PMOS transistor, a source of which is connected to the second power supply voltage and a gate of which is subjected to the first power supply voltage;

a second control NMOS transistor, a drain of which is connected to the drain of the second control PMOS transistor, and a gate and source of which are connected to a second ground voltage;

a third inverter connected to a connection node between the second control PMOS transistor and the second control NMOS transistor, generating the third control signal; and a fourth inverter connected to the third inverter, generating the fourth control signal.

29. The data output circuit of claim 23, wherein the second voltage compensation unit comprises:

a third compensation PMOS transistor, a source of which is connected to the second power supply voltage and a gate of which is subjected to the third control signal; and a fourth compensation PMOS transistor, a source of which is connected to the drain of the first compensation PMOS transistor, a gate of which is subjected to the second data signal, and a drain of which is connected to a connection node between the fourth inversion PMOS transistor and the second inversion NMOS transistor.

30. The data output circuit of claim 23, wherein the first and second data signals have the same level.

* * * * *

UNITED STATES PATENT AND TRADEMARK OFFICE
CERTIFICATE OF CORRECTION

PATENT NO. : 6,822,490 B2
DATED : November 23, 2004
INVENTOR(S) : Dong-ho Hyun et al.

It is certified that error appears in the above-identified patent and that said Letters Patent is hereby corrected as shown below:

Column 24,
Line 16, delete "PMQS" and insert --PMOS --.

Column 26,
Line 23, delete "PMQS" and insert -- PMOS --.

Signed and Sealed this

Fifth Day of April, 2005

JON W. DUDAS
*Director of the United States Patent and Trademark Office*